United States Patent
Chang

(10) Patent No.: US 9,035,814 B2
(45) Date of Patent: May 19, 2015

(54) FEEDFORWARD DELTA-SIGMA MODULATOR

(71) Applicant: Realtek Semiconductor Corp., HsinChu (TW)

(72) Inventor: Che-Wei Chang, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/332,396

(22) Filed: Jul. 16, 2014

(65) Prior Publication Data

US 2015/0022387 A1 Jan. 22, 2015

(30) Foreign Application Priority Data

Jul. 18, 2013 (TW) .............................. 102125774 A

(51) Int. Cl.
*H03M 3/00* (2006.01)

(52) U.S. Cl.
CPC *H03M 3/30* (2013.01); *H03M 3/37* (2013.01); *H03M 3/00* (2013.01)

(58) Field of Classification Search
CPC ........... H03M 3/00; H03M 3/02; H03M 3/30; H03M 3/37; H03M 3/42; H03M 3/406; H03M 3/408; H03M 3/418; H03M 3/452

USPC .................................................. 341/143–160
See application file for complete search history.

(56) References Cited

U.S. PATENT DOCUMENTS

| | | | |
|---|---|---|---|
| 5,629,701 A * | 5/1997 | Ritoniemi et al. ............ | 341/143 |
| 6,396,428 B1 * | 5/2002 | Cheng .......................... | 341/143 |
| 6,788,232 B1 * | 9/2004 | Lee .............................. | 341/143 |
| 7,075,995 B2 * | 7/2006 | Su ............................... | 341/143 |
| 7,554,474 B2 * | 6/2009 | Le Guillou ................... | 341/143 |
| 8,120,518 B2 * | 2/2012 | Jang et al. .................... | 341/143 |

* cited by examiner

*Primary Examiner* — Lam T Mai
(74) *Attorney, Agent, or Firm* — Winston Hsu; Scott Margo

(57) ABSTRACT

A feedforward delta-sigma modulator includes a successive approximation analog-to-digital converter, a digital-to-analog converter, N integrators, a first adder, a second adder, and an optimization zero generation unit, where N is a positive integer. An output terminal of each integrator of the N integrators is coupled to the successive approximation analog-to-digital converter. The digital-to-analog converter is coupled between the first adder and the successive approximation analog-to-digital converter. The first adder is coupled to an input terminal of a first integrator of the N integrator. The second adder is coupled to an input terminal of a $K^{th}$ integrator of the N integrators, where K is a positive integer. The optimization zero generation unit is coupled between an output terminal of a $(K+1)^{th}$ integrator of the N integrators and the second adder.

7 Claims, 3 Drawing Sheets

FEEDFORWARD DELTA-SIGMA MODULATOR

BACKGROUND OF THE INVENTION

1. Field of the Invention

The present invention relates to a feedforward delta-sigma modulator, and particularly to a feedforward delta-sigma modulator that can implement an adder function required by the feedforward delta-sigma modulator in a charge domain.

2. Description of the Prior Art

When a feedforward delta-sigma modulator implements an adder function in a voltage domain, the feedforward delta-sigma modulator increases power consumption due to utilizing additional operational amplifiers. In addition, because limited bandwidth of the additional operational amplifiers can cause excess loop delay (ELD), performance of the feedforward delta-sigma modulator is decreased.

When a feedforward delta-sigma modulator implements an adder function in a current domain, chip area, power consumption, and complexity of the feedforward delta-sigma modulator are increased because transconductance units of the feedforward delta-sigma modulator need enough linearity to maintain linearity of the feedforward delta-sigma modulator.

When a feedforward delta-sigma modulator utilizes ratios of feedforward capacitors to an integrating capacitor of a last stage integrator to implement feedforward coefficients, the feedforward capacitors become larger with the integrating capacitor because the integrating capacitor is usually very large to meet a low noise requirement, resulting in the feedforward delta-sigma modulator needing larger chip area. In addition, the feedforward capacitors can also increase power consumption of operational amplifiers of the feedforward delta-sigma modulator.

Another feedforward delta-sigma modulator utilizes a multi-input comparator to directly connect all feedforward paths, wherein size ratios of input transistors of the feedforward delta-sigma modulator are used for implementing feedforward coefficients. However, a disadvantage of the feedforward delta-sigma modulator with the multi-input comparator is that each feedforward coefficient is sensitive to a common mode voltage of a corresponding integrator output terminal, so large offsets exist between feedforward coefficients of the feedforward delta-sigma modulator when common mode output voltages of integrators of the feedforward delta-sigma modulator are inconsistent.

In addition, because delay time of a quantizer and an analog-to-digital converter can decrease performance of delta-sigma modulator, and even make loop of the delta-sigma modulator unstable, the prior art utilizes an additional digital-to-analog converter between an input terminal of the quantizer and an output terminal of the delta-sigma modulator to compensate the delay time. However, the additional digital-to-analog converter can increase chip area and power consumption of the delta-sigma modulator.

Therefore, the above mentioned feedforward delta-sigma modulators provided by the prior art are not good enough choices for a user.

SUMMARY OF THE INVENTION

In view of the above mentioned problems of the prior art, the present invention provides a feedforward delta-sigma modulator. The feedforward delta-sigma modulator implements an adder function required by the feedforward delta-sigma modulator in a charge domain to solve the above mentioned problems of the prior art.

An embodiment provides a feedforward delta-sigma modulator. The feedforward delta-sigma modulator includes a successive approximation analog-to-digital converter, a digital-to-analog converter, N integrators, a first adder, a second adder, and an optimization zero generation unit. The successive approximation analog-to-digital converter includes N+1 input terminals, and an output terminal for outputting a digital signal, wherein an input terminal of the N+1 input terminals is used for receiving an analog input signal, and N is a positive integer. The digital-to-analog converter is coupled to the output terminal of the successive approximation analog-to-digital converter for receiving the digital signal, and generating an analog feedback signal accordingly. An output terminal of each integrator of the N integrators is coupled to a corresponding input terminal of the N+1 input terminals. The first adder is coupled to the digital-to-analog converter for summing the analog input signal and the analog feedback signal to a first integrator of the N integrators. The second adder is coupled to an input terminal of a $K^{th}$ integrator of the N integrators, wherein an output terminal of the $K^{th}$ integrator is coupled to an input terminal of a $(K+1)^{th}$ integrator of the N integrators, and K is a positive integer less than N. The optimization zero generation unit is coupled between the second adder and an output terminal of the $(K+1)^{th}$ integrator.

Compared to the prior art, the present invention has advantages as follows: first, the present invention implements an adder function required by the feedforward delta-sigma modulator in a charge domain, so in a preferred embodiment of the present invention does not need additional operational amplifiers and transconductance amplifiers, resulting in the present invention having smaller chip area, lower power consumption, and lower complexity; second, capacitances of sampling capacitors of the feedforward delta-sigma modulator only correspond to a capacitance of a reference capacitor (that is, the capacitances of the sampling capacitor are only proportional to the capacitance of the reference capacitor) and unrelated to integrating capacitors within integrators of the feedforward delta-sigma modulator, so the capacitances of the sampling capacitors can be very small, resulting in power consumption of operational amplifiers within the integrators of the feedforward delta-sigma modulator being reduced; third, the present invention is insensitivity to a common mode voltage outputted by each integrator, an output voltage of each integrator, and an amplitude of an analog input signal, so the present invention is suitable for high speed, high resolution, and low power consumption applications.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
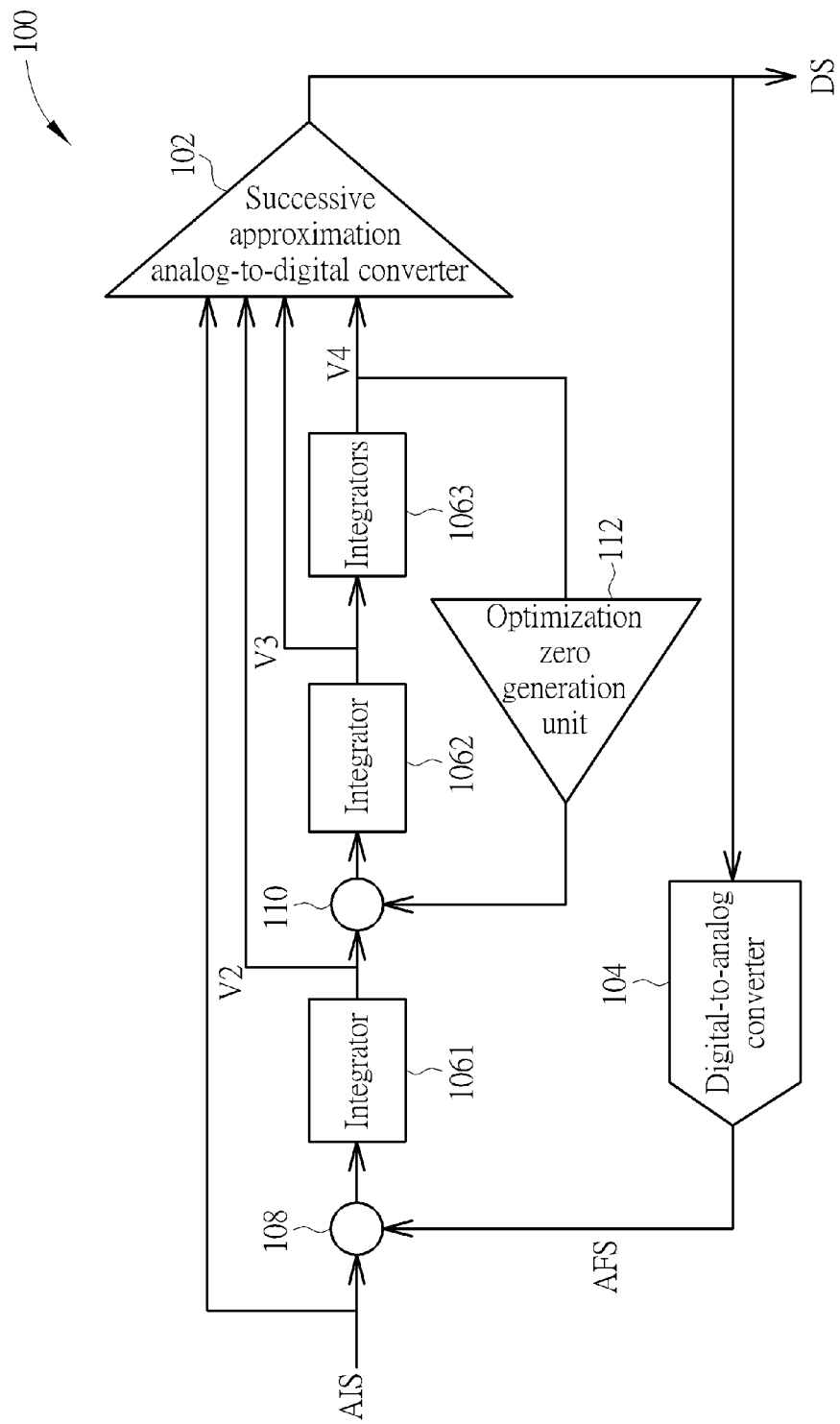
FIG. 1 is a diagram illustrating a feedforward delta-sigma modulator according to an embodiment.

Please refer to FIG. 1. FIG. 1 is a diagram illustrating a feedforward delta-sigma modulator 100 according to an embodiment. As shown in FIG. 1, the feedforward delta-sigma modulator 100 includes a successive approximation analog-to-digital converter 102, a digital-to-analog converter 104, 3 integrators 1061-1063, a first adder 108, a second adder 110, and an optimization zero generation unit 112. But, the present invention is not limited to the feedforward delta-sigma modulator 100 including the 3 integrators 1061-1063. The successive approximation analog-to-digital converter 102 includes 4 input terminals, and an output terminal for outputting a digital signal DS, wherein an input terminal of the 4 input terminals of the successive approximation analog-to-digital converter 102 is used for receiving an analog input signal AIS. The digital-to-analog converter 104 coupled to the output terminal of the successive approximation analog-to-digital converter 102 is used for receiving the digital signal DS and generating an analog feedback signal AFS accordingly. An output terminal of each integrator of the 3 integrators 1061-1063 is coupled to a corresponding input terminal of the 4 input terminals of the successive approximation analog-to-digital converter 102 and an input terminal of a next integrator. For example, an output terminal of the integrator 1061 is coupled to a corresponding input terminal of the 4 input terminals of the successive approximation analog-to-digital converter 102 and an input terminal of the integrator 1062. The first adder 108 is coupled to the digital-to-analog converter 104 and the integrator 1061 for summing the analog input signal AIS and the analog feedback signal AFS to the integrator 1061. The second adder 110 is coupled between the integrator 1061 and the integrator 1062. But, the present invention is not limited to the second adder 110 being coupled between the integrator 1061 and the integrator 1062. That is to say, the second adder 110 can be coupled between any two integrators of the 3 integrators 1061-1063. The optimization zero generation unit 112 is coupled between the second adder 110 and an output terminal of the integrator 1063 for generating zero points to suppress noise of the feedforward delta-sigma modulator 100. But, the present invention is not limited to the optimization zero generation unit 112 being coupled between the second adder 110 and the output terminal of the integrator 1063. That is to say, the optimization zero generation unit 112 can be coupled between an input terminal of an integrator of any two adjacent integrators and an output terminal of the other integrator of the any two adjacent integrators.

Figure 2:
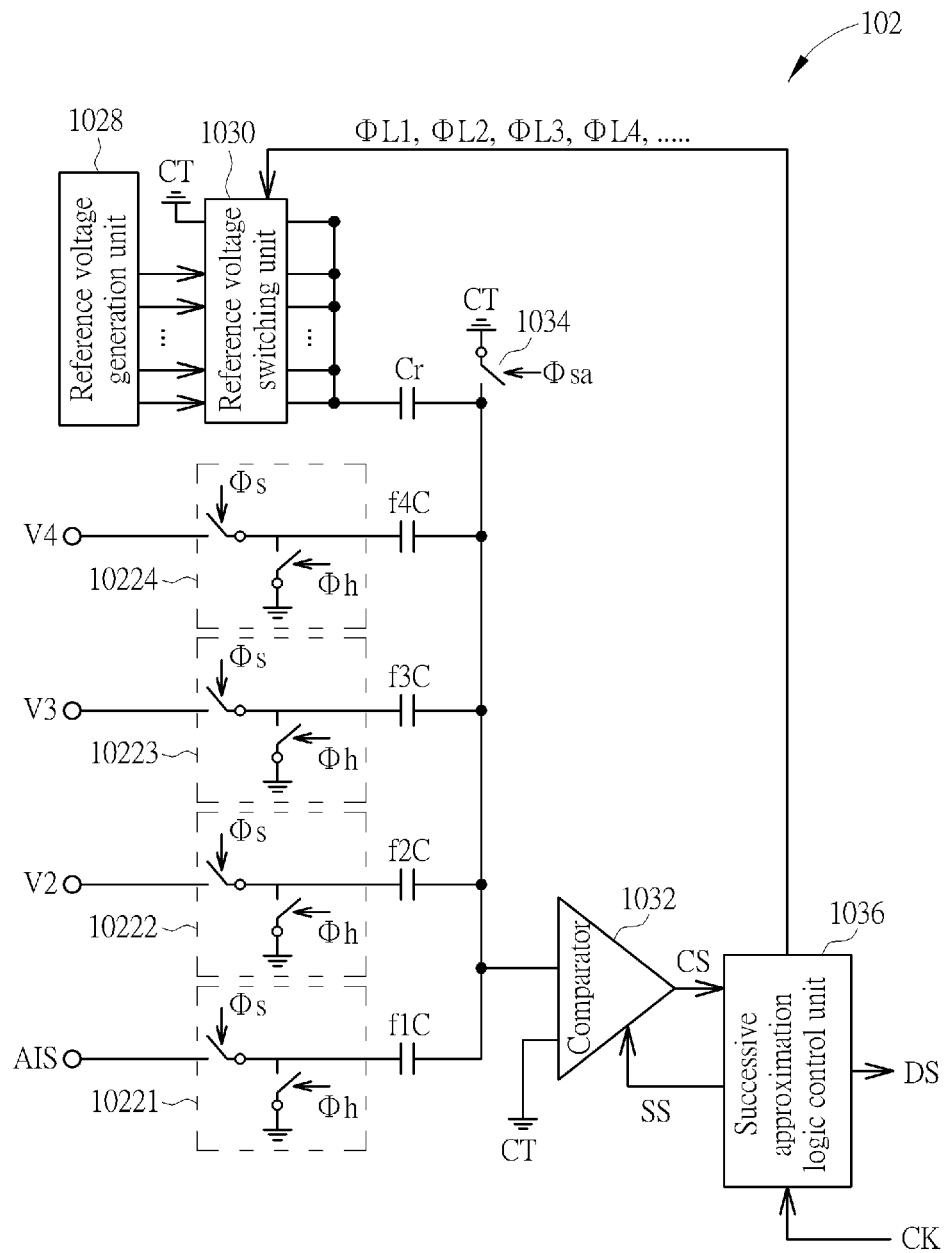
FIG. 2 is a diagram illustrating the successive approximation analog-to-digital converter according to an embodiment.

Please refer to FIG. 2. FIG. 2 is a diagram illustrating the successive approximation analog-to-digital converter 102 according to an embodiment. As shown in FIG. 2, the successive approximation analog-to-digital converter 102 includes 4 switch units 10221-10224, 4 sampling capacitors f1C-f4C, a reference capacitor Cr, a reference voltage generation unit 1028, a reference voltage switching unit 1030, a comparator 1032, a common mode switch 1034, and a successive approximation logic control unit 1036. The first switch unit 10221 of the 4 switch units 10221-10224 is coupled to an input terminal of the first adder 108 and the first sampling capacitor f1C of the 4 sampling capacitors f1C-f4C, each switch unit of other switch units of the 4 switch units 10221-10224 is coupled between an output terminal of each integrator of the 3 integrators 1061-1063 and a corresponding sampling capacitor of the 4 sampling capacitors f1C-f4C, and capacitances of the 4 sampling capacitors f1C-f4C are proportional to each other. For example, the switch unit 10222 is coupled between the output terminal of the integrator 1061 and the corresponding sampling capacitor f2C. The reference voltage generation unit 1028 is used for generating a plurality of reference voltages. The reference voltage switching unit 1030 includes a plurality of switches, and the reference voltage switching unit 1030 is coupled to the reference voltage generation unit 1028, the reference capacitor Cr, and a common mode terminal CT, wherein the plurality of switches are used for determining a first terminal of the reference capacitor Cr to receive a common mode voltage of the common mode terminal CT or a reference voltage of the plurality of reference voltages. The comparator 1032 includes a first input terminal coupled to the 4 sampling capacitors f1C-f4C and the reference capacitor Cr, a second input terminal coupled to the common mode terminal CT, a third input terminal for receiving a strobe signal SS, and an output terminal for outputting a comparison signal CS. The common mode switch 1034 includes a first terminal coupled to the 4 sampling capacitors f1C-f4C and the reference capacitor Cr, and a second terminal coupled to the common mode terminal CT. The successive approximation logic control unit 1036 includes a first input terminal for receiving a clock CK, a second input terminal for receiving the comparison signal CS, a first output terminal for outputting the strobe signal SS, a second output terminal for outputting a control signal, and a third output terminal for outputting the digital signal DS.

Figure 3:
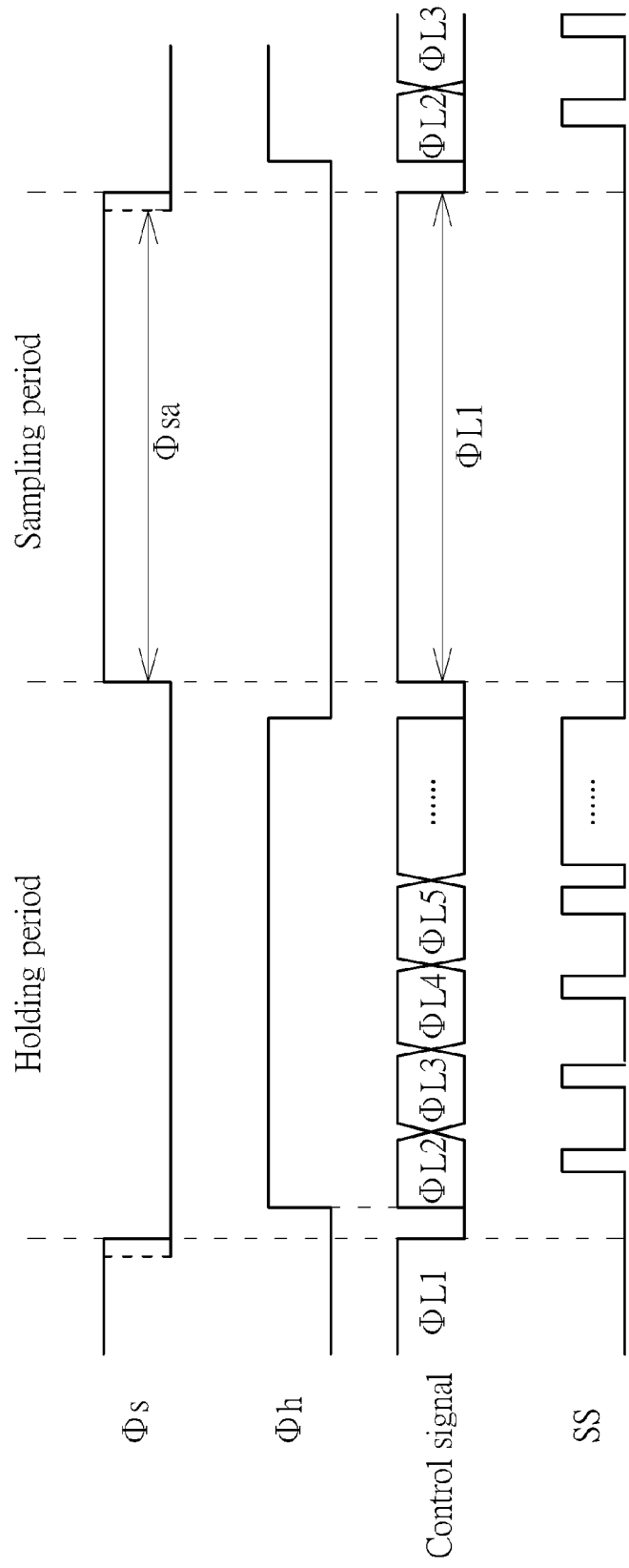
FIG. 3 is a diagram illustrating operation timing of the successive approximation analog-to-digital converter.

Please refer to FIG. 3. FIG. 3 is a diagram illustrating operation timing of the successive approximation analog-to-digital converter 102. The feedforward delta-sigma modulator 100 utilizes a principle of charge conservation to implement addition through charge-redistribution. In addition, the feedforward delta-sigma modulator 100 utilizes ratios of the capacitances of the 4 sampling capacitors f1C-f4C to a capacitance of the reference capacitor Cr to implement feedforward coefficients f1-f4.

During a sampling signal $\Phi s$, the common mode switch 1034 receives a common mode switch signal $\Phi sa$, so the common mode switch 1034 is turned on, resulting in second terminals of the sampling capacitors f1C-f4C and a second terminal of the reference capacitor Cr receive the common mode voltage of the common mode terminal CT. That is, the second terminals of the sampling capacitors f1C-f4C and the second terminal of the reference capacitor Cr are reset. When the 4 switch units 10221-10224 receive the sampling signal $\Phi s$ (a sampling period as shown in FIG. 3), first terminals of the sampling capacitors f1C-f4C sample the analog input signal AIS and the output voltages V2-V4 of the output terminals of the 3 integrators 1061-1063, respectively. During the sampling signal $\Phi s$, the successive approximation logic control unit 1036 generates a control signal $\Phi L1$ to the reference voltage switching unit 1030 according to a previous digital signal outputted by the feedforward delta-sigma modulator 100. Therefore, the reference voltage switching unit 1030 can switch the first terminal of the reference capacitor Cr to receive a corresponding reference voltage of the plurality of reference voltages generated by the reference voltage generation unit 1028 according to the control signal $\Phi L1$. Thus, the feedforward delta-sigma modulator 100 can complete excess loop delay compensation without an additional digital-to-analog converter required by the prior art.

When the 4 switch units 10221-10224 receive a holding signal $\Phi h$ (a holding period as shown in FIG. 3), the first terminals of the sampling capacitors f1C-f4C receive the common mode voltage of the common mode terminal CT, so the analog input signal AIS and the output voltages V2-V4 of the output terminals of the 3 integrators 1061-1063 sampled by the sampling capacitors f1C-f4C during the sampling signal $\Phi s$ can be transmitted to the second terminals of the sampling capacitors f1C-f4C. Meanwhile, the successive approximation logic control unit 1036 generates a control signal $\Phi L2$ to the reference voltage switching unit 1030. Therefore, the reference voltage switching unit 1030 can switch the first terminal of the reference capacitor Cr to receive the common mode voltage of the common mode terminal CT according to the control signal ΦL2, resulting in the corresponding reference voltage received by the reference capacitor Cr during the sampling signal Φs can also transmitted to the second terminal of the reference capacitor Cr. Thus, charges of the second terminal of the reference capacitor Cr and charges of the second terminals of the sampling capacitors f1C-f4C can be redistributed.

After the control signal ΦL2 is generated, the successive approximation logic control unit 1036 can generate the strobe signal SS to drive the comparator 1032 and generate control signals ΦL3, ΦL4, ΦL5, . . . to the reference voltage switching unit 1030 according to the clock CK, so the reference voltage switching unit 1030 can switch the first terminal of the reference capacitor Cr to receive a corresponding reference voltage of the plurality of reference voltages generated by the reference voltage generation unit 1028 according to the control signals ΦL3, ΦL4, ΦL5, . . . . Therefore, when the first terminal of the reference capacitor Cr is switched to receive a corresponding reference voltage of the plurality of reference voltages generated by the reference voltage generation unit 1028 every time, the charges of the second terminal of the reference capacitor Cr and the charges of the second terminals of the sampling capacitors f1C-f4C can be redistributed to generate a corresponding voltage. Meanwhile, the comparator 1032 can complete traditional successive approximation analog-to-digital conversion according to the corresponding voltage and the common mode voltage of the common mode terminal CT.

In addition, the above mentioned embodiment only utilizes single-ended operation to describe the present invention. That is, the present invention is not limited to single-ended operation or differential operation.

To sum up, compared to the prior art, the feedforward delta-sigma modulator provided by the present invention has advantages as follows: first, the present invention implements an adder function required by the feedforward delta-sigma modulator in a charge domain, so in a preferred embodiment of the present invention does not need additional operational amplifiers and transconductance amplifiers, resulting in the present invention having smaller chip area, lower power consumption, and lower complexity; second, the capacitances of the sampling capacitors of the feedforward delta-sigma modulator only correspond to the capacitance of the reference capacitor (that is, the capacitances of the sampling capacitor are only proportional to the capacitance of the reference capacitor) and unrelated to integrating capacitors within the integrators, so the capacitances of the sampling capacitors can be very small, resulting in power consumption of the operational amplifiers within the integrator being reduced; third, the present invention is insensitivity to a common mode voltage outputted by each integrator, an output voltage of each integrator, and an amplitude of an analog input signal, so the present invention is suitable for high speed, high resolution, and low power consumption applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedforward delta-sigma modulator, comprising:
    a successive approximation analog-to-digital converter comprising N+1 input terminals, and an output terminal for outputting a digital signal, wherein an input terminal of the N+1 input terminals is used for receiving an analog input signal, and N is a positive integer;
    a digital-to-analog converter coupled to the output terminal of the successive approximation analog-to-digital converter for receiving the digital signal, and generating an analog feedback signal accordingly;
    N integrators, wherein an output terminal of each integrator of the N integrators is coupled to a corresponding input terminal of the N+1 input terminals;
    a first adder coupled to the digital-to-analog converter for summing the analog input signal and the analog feedback signal to a first integrator of the N integrators;
    a second adder coupled to an input terminal of a $K^{th}$ integrator of the N integrators, wherein an output terminal of the $K^{th}$ integrator is coupled to an input terminal of a $(K+1)^{th}$ integrator of the N integrators, and K is a positive integer less than N; and
    an optimization zero generation unit coupled between the second adder and an output terminal of the $(K+1)^{th}$ integrator.

2. The feedforward delta-sigma modulator of claim 1, wherein the successive approximation analog-to-digital converter comprises:
    N+1 switch units;
    N+1 sampling capacitors, wherein a first switch unit of the N+1 switch units is coupled to the input terminal of the first adder and a first sampling capacitor of the N+1 sampling capacitors, and each switch unit of other switch units of the N+1 switch units is coupled between an output terminal of each integrator of the N integrators and a corresponding sampling capacitor of the N+1 sampling capacitors;
    a reference capacitor, wherein capacitances of the N+1 sampling capacitors are proportional to a capacitance of the reference capacitor;
    a reference voltage generation unit for generating a plurality of reference voltages;
    a reference voltage switching unit comprising a plurality of switches, the reference voltage switching unit being coupled to the reference voltage generation unit, the reference capacitor, and a common mode terminal, wherein the plurality of switches are used for determining a first terminal of the reference capacitor to receive a common mode voltage of the common mode terminal or a reference voltage of the plurality of reference voltages;
    a comparator comprising a first input terminal coupled to the N+1 sampling capacitors and the reference capacitor, a second input terminal coupled to the common mode terminal, a third input terminal for receiving a strobe signal, and an output terminal for outputting a comparison signal;
    a common mode switch comprising a first terminal coupled to the N+1 sampling capacitors and the reference capacitor, and a second terminal coupled to the common mode terminal; and
    a successive approximation logic control unit comprising a first input terminal for receiving a clock, a second input terminal for receiving the comparison signal, a first output terminal for outputting the strobe signal, a second output terminal for outputting a control signal, and a third output terminal for outputting the digital signal.

3. The feedforward delta-sigma modulator of claim 2, wherein when the first switch unit receives a sampling signal, a first terminal of the first sampling capacitor samples the analog input signal, when the switch unit receives the sampling signal, a first terminal of the corresponding sampling capacitor samples an output voltage of the output terminal of the integrator, and during the sampling signal, the successive approximation logic control unit controls the reference voltage switching unit to switch the reference capacitor to receive a corresponding reference voltage of the plurality of reference voltages according to the control signal, wherein the corresponding reference voltage corresponds to a previous digital signal outputted by the successive approximation logic control unit.

4. The feedforward delta-sigma modulator of claim 2, wherein when the switch unit receives a holding signal, a first terminal of the corresponding sampling capacitor receives the common mode voltage, when the first switch unit receives the holding signal, a first terminal of the first sampling capacitor receives the common mode voltage, and the successive approximation logic control unit controls the reference voltage switching unit to switch the first terminal of the reference capacitor to receive the common mode voltage according to the control signal at a beginning of the holding signal.

5. The feedforward delta-sigma modulator of claim 4, wherein when the first terminal of the corresponding sampling capacitor receives the common mode voltage, the corresponding sampling capacitor transmits an output voltage of the output terminal of the integrator to a second terminal of the corresponding sampling capacitor, and when the first terminal of the first sampling capacitor receives the common mode voltage, the first sampling capacitor transmits the analog input signal to a second terminal of the first sampling capacitor.

6. The feedforward delta-sigma modulator of claim 4, wherein during the holding signal and after the first terminal of the reference capacitor receives the common mode voltage, the successive approximation logic control unit controls the reference voltage switching unit to make the reference capacitor receive a corresponding reference voltage of the plurality of reference voltages according to the control signal.

7. The feedforward delta-sigma modulator of claim 2, wherein during a sampling signal, the common mode switch is turned ON, and second terminals of the N+1 sampling capacitors and a second terminal of the reference capacitor is coupled to the common mode terminal.

* * * * *